3,130,050
Patented Apr. 21, 1964

3,130,050

OIL-DISPERSED DYES IN PHOTOPOLYMERIZATION SYSTEMS

Andre K. Schwerin, Binghamton, N.Y., assignor to General Aniline & Film Corporation, New York, N.Y., a corporation of Delaware No Drawing. Filed Jan. 18, 1960, Ser. No. 2,845
14 Claims. (Cl. 96—35)

The present invention relates to coatings capable of being converted to imagewise photopolymerized resists of a compound containing the grouping $CH_2{=}C{<}$, said resist having an oil-soluble colorant such as a dye or pigment dispersed therein, producing high resolving power, and to said resist and its method of preparation.

There are a number of well known photopolymerization processes in which a hydrophilic monomer containing the group $CH_2{=}C{<}$ and a light-sensitive photopolymerization catalyst are coated in a colloidal carrier onto a base such as metal, paper, film or the like and after exposure to whitelight to a suitable subject, are subjected to a wash-out operation with water or another suitable liquid such as alcohol which removes the unpolymerized monomer from the coating. As a result, the polymer formed on exposure remains as an imagewise resist insoluble in the wash-out solvent.

In order to enhance the differential between the polymerized and unpolymerized parts of the coating and to obtain a visible image, it is often the practice to dye the resist with water-soluble dyes or inks.

For adhesion reasons, photopolymerizable coatings as outlined above can be applied to the coating surface only when this surface is provided with a thin overcoat or subbing layer composed in general of a hardened colloid such as gelatin. As a consequence, the water-soluble dyes present in the coating have a tendency to diffuse into the subcoat during the coating and wash-out operations, producing an undesired coloration of the background of the base. Moreover, the dyes present in the photopolymerized resist leach out from the resist during the wash-out operation, producing an image having a certain fuzziness, being unsharp and non-contrasty.

I have now found that these objections can be overcome by the use of oil-soluble colorants such as dyes and pigments which may be either dissolved or dispersed in suitable, low boiling organic solvents and then further dispersed into the aqueous solution containing the polymerizable monomer. Such a technique prevents any diffusion of the colorant from the coating to the sublayer, producing, therefore, clean, untinted backgrounds. Moreover, the oil-dispersed colorant will not leach out of the formed photopolymer during the wash-out operation. There is, therefore, no loss in over-all density due to dye diffusion. As a further result, the resist will present very sharp edges and will have high over-all density combined with high resolving power, especially when the average size of the oily droplets containing the colorant is reduced to one micron or less. Another advantage is the ease with which the wash-out operation may be effected. With the new method, the elimination of the unpolymerized areas of the exposed coating by a stream of lukewarm water is achieved in a few seconds. This is probably due to the presence in the coating of the organic solvents which act as plasticizers and facilitate the separation of polymerized and unpolymerized masses.

Light-sensitive photopolymerizable coatings containing a colloidal carrier, a photopolymerization catalyst, a compound containing the grouping $CH_2{=}C{<}$, and an oil-soluble colorant in a substantially water-insoluble, low molecular weight organic crystalloidal material having a boiling point of above about 175° C., resists prepared from said light-sensitive material and the method of producing such resist constitute the purposes and objects of my invention.

My new technique using oil-dispersed colorants may be employed in any photopolymerization process in which the photopolymerized resist may serve as a matrix for reproduction or printing processes.

In preparing the light-sensitive photopolymerizable material of the present invention, I may use any photopolymerization catalyst capable of converting to a polymer, a monomer containing the grouping $CH_2{=}C{<}$. Typically, I may use the silver compounds which are described in application Serial No. 715,528, filed by Steven Levinos on February 17, 1958. Examples of such silver compounds are silver acetate, silver acetylide, silver benzoate and silver chloride, to name a few of the catalysts of said application.

It would also be possible to employ light-sensitive silver salt emulsions as described in application Serial No. 731,538, filed by Steven Levinos and Fritz W. H. Mueller on April 28, 1958.

Another system which I have found to be suitable for my purposes is that described in application Serial No. 822,764, filed by Steven Levinos on June 25, 1959. Examples of photopolymerization catalysts suggested for use in this application are the uranyl salts of formic acid, acetic acid, propionic acid, butyric acid and oxalic acid, to name just a few.

Still another method which may be resorted to is described in application Serial No. 765,958, filed by Steven Levinos on October 8, 1958. In this application, it is suggested that there be used a mixture of a silver halide and a silver compound more soluble than the halide. Typically, reference is made to a mixture of a silver halide with silver acetate, silver propionate, silver citrate, silver fluoride, silver lactate and the like.

Still another system which I have found to be effective is described in application Serial No. 765,275, filed by Steven Levinos and Fritz W. H. Mueller on October 6, 1958. This application contemplates the use as a photopolymerization catalyst of a mixture of a silver compound an an amphoteric metal oxide such as zinc oxide, titanium dioxide, zirconium dioxide and silicon dioxide.

Resort may also be had to the system described in application Serial No. 792,978, filed by the present applicant on February 13, 1959. In this process, photopolymerization is induced by the utilization of anthraquinone sulfonic acids such as 2,7-anthraquinone-disulfonic acid, 1,8-anthraquinone-disulfonic acid or the like.

Another method of effecting photopolymerization is described in application Serial No. 783,725, filed by Helene D. Evans, Fritz W. H. Mueller and Steven Levinos on December 30, 1958. In this application, it is recommended that photopolymerization be effected with an amphoteric metal oxide such as previously mentioned, particularly when the oxide is promoted by use of salts having a cation of the group of mercury, thallium or iron; organic compounds of the group of organic carboxylic acids, salts of said acids and the like; and dyes of the class of amino fluorimes; hydroxy fluorimes and the like. A typical promoter for the amphoteric metal oxide is thallous sulfate, thallous nitrate, thallous phosphate or the like.

Another system which produces satisfactory resists is described in application Serial No. 808,882 filed by Helene D. Evans on April 27, 1959. According to this system, there is employed as the photopolymerization catalyst a radiation-sensitive ferric salt which is used during processing in the presence of a per compound. Illustratively, the applicant refers to the use as the iron salt of ferric ammonium citrate and as the per compound to di-t-butyl peroxide.

Still another system which may be employed is described in application Serial No. 836,330, filed by Steven Levinos on August 27, 1959. According to this application, the photopolymerization catalyst is a sulfide, selenide or telluride of a metal such as aluminum, mercury, manganese, zinc and chromium, to mention but a few.

A very effective system is also described in application Serial No. 823,005 filed by Steven Levinos on June 26, 1959. This application is directed to the use as the photopolymerization catalyst of a mixture of an aromatic diazonium compound and a dye which may be an azo dye, cyanine dye, ozanol dye or the like. In this application, it is recommended, for instance, in Example I, that the photopolymerization catalyst be a mixture of p-4-morpholinyl-benzenediazonium chloride and 3-allyl-5-[2-(3 - ethyl - 2(3) - benzoxazolylidene) - ethylidene] - 2-thiohydantoin.

A further technique for effecting photopolymerization is described in application Serial No. 834,630, filed by Fritz W. H. Mueller and Curt B. Roth on August 19, 1959. This application recommends the use as the photopolymerization catalyst of a thallium salt such as, for example, thallous nitrate.

Finally, resort may be had to the teachings of U.S. Patent 2,875,047 which proposes the use of a photoreducible dye and a mild reducing agent as the photopolymerization catalyst.

It will be evident from this résumé with regard to the photopolymerization systems that may be employed that the particular nature of the catalyst is not critical. It is only essential that the catalyst be capable of photopolymerizing a hydrophilic monomer containing the grouping $CH_2{=}C<$ under white-light exposure in the presence of a colloidal binder such as gelatin, polyvinyl alcohol, carboxymethyl cellulose, casein or the like.

The hydrophilic monomer which I employ may be acrylamide, methacrylamide, methylolacrylamide, N-ethanolacrylamide, acrylonitrile, methacrylic acid, acrylic acid, calcium acrylate, vinylpyrrolidone, vinylmethyl ether, N,N'-methylene-bis-acrylamide and the like. As a matter of fact, any hydrophilic monomer containing the aforesaid grouping is suitable for use in my purposes.

It is recognized that the molecular weight and hence the ultimate hardness of the resist can be increased by utilizing during photopolymerization a small amount of an unsaturated compound containing at least two terminal vinyl groups each linked to a carbon atom in a straight chain or in a ring. These compounds serve to cross-link the monomeric chain and are generally designated as cross-linking agents. N,N' - methylene - bis - acrylamide which may also be used as the monomer is an example of such a cross-linking agent. Other agents are described, for example, by Kropa and Bradley in vol. 31, No. 12, of "Industrial and Engineering Chemistry," 1939. Among such agents may be mentioned triallyl cyanurate, divinyl benzene, divinyl ketones and diglycol-diacrylate.

Generally, the cross-linking agent is employed in an amount ranging from 10–50 parts of monomer to each part of the cross-linking agent. It is understood that the greater the quantity of cross-linking agent within such range, the harder the polymer obtained.

The ratio of the catalyst to the photopolymerization monomer will be relatively small. Thus, I have obtained satisfactory results with a quantity of catalyst equal to about 1/70,000 of the weight of the monomer. Greater amounts of the catalyst may be employed and, in this connection, excellent results have been obtained with amounts ranging up to 20%. It is, of course, understood that there will be an optimum amount of monomer to catalyst, depending upon the particular catalytic system which is employed. However, any person skilled in the art having decided upon the catalyst and the monomer can readily determine the amount which will give best results. In any case, it is to be pointed out that the particular catalyst and monomer and the quantities thereof which are employed are not critical features of the invention. On the contrary, the invention resides in the use of oil-soluble colorants which are to be incorporated in the photopolymerizable hydrophilic coatings in order to improve the characteristics of the resist obtained.

It has been previously pointed out that the oil-soluble colorants are dissolved in an oily solvent and then dispersed in the hydrophilic colloidal carrier. The oil which is employed for dissolving the colorant is a substantially water-insoluble, low molecular weight, organic crystalloidal material having a boiling point of about 175° C., said crystalloidal material having high solvent action for the colorant and the nature and proportions of the colorant and crystalloidal material being so chosen that particles thereof are liquid under conditions of coating. Examples of such oily solvents are tricresyl phosphate, dibutyl phthalate, 2-methoxybutyl phthalate, phenethyl alcohol, triphenyl phosphate, n-butyl sulfone, N-hexylphenylcarbinol, benzoyl piperidine or the like. Attention is directed to U.S. Patent 2,322,027 which lists additional oily solvents.

There are numerous oil-soluble dyes or pigments which may be incorporated in photopolymerizable hydrophilic coatings by my method. Illustrative of such dyes are:

Oil Blue GA, Color Index 61525, volume 3
Oil Blue C, Color Index 2879, volume 1
Oil Red, Color Index 26125, volume 3
Nigrosine BSS, Color Index 50415, volume 3
Oil Black BT, Color Index 26150, volume 3
Oil Brown G, Color Index 12020, volume 3
Oil Yellow, Color Index 11020, volume 3 and the quinonimine dyes obtained by color-forming development of the color formers described in U.S. Patents 2,369,489, 2,423,730 and 2,600,788. These color formers and the dyes produced therefrom are known in the trade as lipophilic or oil-soluble and are recommended for use when subtractively colored resists are desired.

The Color Index and Schultze tables list a great number of colorants and the properties thereof. It is, therefore, a simple matter for anyone to refer to these authoritative textbooks to select oil-soluble dyes for use in the present process.

In operation, the oil containing the colorant is dispersed either by hand stirring or by a blending machine such as a Waring Blendor into the water-soluble colloidal carrier employed. Ultrasonic emulsion preparation or other dispersion techniques may likewise be utilized.

To facilitate the preparation of the oil-water emulsion, dispersion agents may be added to the hydrophilic colloidal carrier. For this purpose, use may be made of saponin, sulfated alcohols such as lauryl sulfate, the reaction products of long chain fatty acid chlorides with sarcosine or taurine such as oleyl-N-methyl taurine, polyoxyethylene derivatives such as polyglycols, the reaction product of diamylphenol with, say, 20 mols of ethylene oxide or the like. These wetting agents are available on the open market and any person skilled in the art has a choice of the dispersing agents to be employed.

In order to obtain a dye dispersion producing a photopolymerized resist of high resolving power, the average oil droplet size should be equal to or smaller than one micron. Such small droplet size not only increases the resolving power of the resist but produces, through increase of the total surface, a high over-all dye density.

Previous mention was made to the fact that the base of the photopolymerizable coatings should bear a sublayer. It is general practice to coat such a layer to a thickness of 2–3 microns.

The photopolymerizable layer which bears as essential components the colloidal carrier, the monomer, the photopolymerization catalyst and the colorant dissolved in the oil and dispersed in the carrier is generally coated to a thickness of 5–8 microns.

It has been found that best results are obtained when a humectant is used in the coating. For this purpose, resort may be had to glycerol, ethylene glycol, sorbitol or the like.

The process of forming resists using my light-sensitized photopolymerization material is easily carried out. The light sensitized material is exposed under a pattern to whitelight, for instance, according to Example I. Where the light passes through the pattern, photopolymerization of the light-sensitized material takes place to produce hydrophobic areas. The exposed light-sensitized material is then subjected to the action of a hydrophilic solvent such as water, alcohol or the like for a matter of seconds to remove the unexposed, unpolymerized areas. A resist having improved characteristics is thus obtained.

The invention is, of course, utilizable to form a subtractively colored, multicolored resist, for example, by the repeated physical transfer of a yellow, magenta and cyan resist to a paper or similar support. In such case, the yellow resist will be prepared as indicated but while representing the blue features of the pattern, the magenta resist while representing the green features of the pattern, and the cyan resist while representing the red features of the pattern. To obtain the proper color in each resist, the colorant in the yellow resist may be a dye obtained according to U.S. Patent 2,298,443 or Oil Yellow; that in the magenta resist a dye obtained according to U.S. Patent 2,600,788; and that in the cyan resist a dye obtained according to U.S. Patent 2,474,293.

The same result could also be obtained by using the mixed grain procedure described in my copending application Serial No. 693,998, filed November 1, 1957, excepting, of course, that the oil droplets would contain a photopolymerization catalyst in addition to the oil-soluble colorant. In such a system, the catalyst need not necessarily be a silver halide emulsion but could be any one of the catalysts previously mentioned. In such a system, the same yellow, magenta and cyan colorants as used in the transfer process could be employed. Inasmuch as proximity development is not a problem in this system, it is not necessary to space the oily packets as provided for in my application Serial No. 693,998.

Processing of this light-sensitive material would follow the pattern of mixed grain, monolayer materials as regards exposure and the pattern of my technique herein outlined as regards removal of unexposed photopolymerization material. A three-colored resist would result from this procedure.

The invention will be further understood by a reference to the following examples, it being understood that the examples are illustrative only.

*Example I*

A film base is coated to a thickness of 2–3 microns with the following composition:

| | | |
|---|---|---|
| Gelatin | g. | 25 |
| Water | cc. | 975 |
| Chrome alum (5%) | cc. | 20 |
| Lauryl sulfate (25%) | cc. | 5 |

A photopolymerizable composition of the monomer (hereafter called A–5) is prepared with the following formulation:

| | | |
|---|---|---|
| Acrylamide | g. | 160 |
| N,N′-methylene-bis-acrylamide | g. | 7 |
| Water | cc. | 120 |

Nigrosine SSB (1 g.) is then dissolved in 3 g. of tricresyl phosphate. The oily solution obtained is dispersed in the following composition:

| | Cc. |
|---|---|
| Gelatin (10%) | 50 |
| Lauryl sulfate (25%) | 4 |
| Water | 50 |
| A–5 | 10 |
| Ferric ammonium citrate, 1 M | 10 |
| Glycerol | .5 |

This composition is then coated on film base and dried. The coating is exposed through a photographic negative with a 375 watt reflector. The exposed coating is then treated for 30 seconds in a 1% solution of hydrogen peroxide and washed out with lukewarm water. The black resist obtained has a resolving power of more than 200 lines per millimeter. The background of the coating after wash-out of the unpolymerized parts is clean and free from any dye staining.

*Example II*

.4 g. of Oil Blue GA is dissolved in 5 g. of dibutyl phthalate. The oily solution is dispersed in the following composition:

| | | |
|---|---|---|
| Gelatin (10%) | cc. | 30 |
| Lauryl sulfate (25%) | cc. | .5 |
| Gelatino-silver chloride emulsion | g. | 50 |
| A–5 | cc. | 6 |
| Glycerol | cc. | 1 |

The composition is coated on a paper base and dried. After exposure to whitelight through a lettered photographic negative, the unpolymerized parts of the coating are washed out with water. The remnant resist is composed of sharp, dark letters on a white, unstained background.

The silver chloride emulsion used contains a quantity of silver halide ranging from 10–40% by weight and the emulsion has a specific gravity ranging from 1.05 to 1.2.

*Example III*

1 g. of Oil Blue C is dissolved in 2 g. of 2-methoxybutyl phthalate. The oily solution is then dispersed in the following composition:

| | Cc. |
|---|---|
| Gelatin (10%) | 50 |
| Lauryl sulfate (25%) | 4 |
| Water | 50 |
| A–5 | 10 |
| Ferric ammonium citrate, 1 M | 10 |
| Glycerol | .5 |

The resulting composition is coated on film base which was subbed as in Example I and dried. By treatment as in Example I, results similar to those of Example I are obtained.

*Example IV*

.6 g. of Oil Red is dissolved in 2 g. of phenethyl alcohol. The oily solution is then dispersed in the following composition:

| | | |
|---|---|---|
| Gelatin (10%) | cc. | 50 |
| Lauryl sulfate (25%) | cc. | 4 |
| A–5 | cc. | 10 |
| Ferric ammonium citrate, 1 M | cc. | 10 |
| Sorbitol | g. | 6 |

The resulting composition is coated on a paper base and processed as in Example I. The red resist has a resolving power of more than 200 lines per millimeter. The background of the coating after wash-out of the unpolymerized parts is clean and free from dye stain.

*Example V*

.7 g. of Nigrosine BSS is dissolved in 3 g. of tricresyl phosphate. The oily solution is dispersed in the following composition:

| | Cc. |
|---|---|
| Polyvinyl alcohol (7.5%) | 50 |
| Lauryl sulfate (25%) | .5 |
| Water | 50 |
| A-5 | 10 |
| Ferric ammonium citrate, 1 M | .5 |

This composition is coated on a paper base, dried and processed as in Example IV. The results are similar to those obtained in Example IV.

*Example VI*

1.5 g. of silver nitrate dissolved in 10 ml. of water are added to .52 g. of sodium chloride previously dissolved in 15 ml. of water. 35% ammonium hydroxide solution is added until dissolution of the precipitate occurs.

To 3 ml. of the above solution are added 3 ml. of a .1% eosin solution.

To 5 ml. of the resulting solution are added 35 ml. of inert gelatin and 10 ml. of a 60% aqueous solution of acrylamide.

The resulting composition after addition of the oily dispersion of Example I is coated on a subbed film base and photopolymerized as in Example I. The results are similar to those obtained in Example I.

*Example VII*

The procedure is the same as in Example II excepting that the A-5 is replaced by methylolacrylamide in an amount equivalent to the acrylamide used in Example II.

*Example VIII*

The procedure is the same as in Example III excepting that the A-5 is replaced by acrylonitrile in an amount equivalent to the acrylamide in A-5.

Modifications of the invention will occur to persons skilled in the art. Typically, any hydrophilic monomer mentioned may be used in lieu of those of the examples. I, therefore, do not intend to be limited in the patent granted except as necessitated by the appended claims.

I claim:

1. A light-sensitive material comprising a suitable support carrying a photopolymerizable layer capable of yielding upon imagewise exposure and processing a photoresist image that has a clear background and is sharp, colored and contrasty, said coating being of hydrophilic character and comprising a hydrophilic colloidal carrier material, a hydrophilic monomer containing the grouping $CH_2{=}C{<}$, a photopolymerization catalyst and having dispersed within said carrier materials, droplets of a solution of an oil-soluble, lipophilic dye dissolved in a substantially water-insoluble, low molecular weight organic crystalloidal material having a boiling point above 175° C., and selected from the group consisting of tricresyl phosphate, dibutyl phthalate, 2-methoxybutyl phthalate, phenethyl alcohol, triphenyl phosphate, n-butyl sulfone, N-hexylphenylcarbinol, benzoyl piperidine, said crystalloidal material having a high solvent action for said oil-soluble dye, said dye and said crystalloidal material being so chosen that particles thereof are liquid under the conditions of coating said layers.

2. The product as defined in claim 1 wherein the support is a film base having interpolated between the base and the hydrophilic coating a hydrophilic subcoat of a hardened hydrophilic colloid.

3. The article as defined in claim 2 wherein the subcoat has a thickness of 2-3 microns.

4. The article as defined in claim 1 wherein the hydrophilic coating has a thickness of from about 5-8 microns.

5. The article as defined in claim 1 wherein the dispersion in said carrier of a solution of an oil-soluble colorant in the solvent therefor has a size of not more than one micron.

6. The article as defined in claim 1 wherein the photopolymerization catalyst is a silver salt.

7. The article as defined in claim 1 wherein the photopolymerization catalyst is a silver salt emulsion.

8. The article as defined in claim 1 wherein the photopolymerization catalyst is a mixture of two silver salts, one being a silver halide and the other being a silver salt more soluble than the silver halide.

9. The article as defined in claim 1 wherein the photopolymerization catalyst is an anthraquinone sulfonic acid.

10. The article as defined in claim 1 wherein the photopolymerization catalyst is a thallous salt.

11. The article as defined in claim 1 wherein the photopolymerization catalyst is an amphoteric metal oxide.

12. The article as defined in claim 1 wherein the photopolymerization catalyst is a combination of a ferric salt and a per compound.

13. The process of producing a resist with an image that has clear backgrounds and is sharp, colored and contrasty, which comprises exposing to light a light-sensitive material carrying on a suitable base a hydrophilic layer containing a hydrophilic colloidal carrier, a hydrophilic monomer containing the grouping $CH_2{=}C{<}$, a photopolymerization catalyst and having dispersed within said carrier, droplets of a solution of an oil-soluble, lipophilic dye in a substantially water-insoluble, low molecular weight organic crystalloidal material having a boiling point of above 175° C., and being selected from the group consisting of tricresyl phosphate, dibutyl phthalate, 2-methoxybutyl phthalate, phenethyl alcohol, triphenyl phosphate, n-butyl sulfone, N-hexylphenylcarbinol, benzoyl piperidine, said crystalloidal material having a high solvent action for the dye, the nature and proportions of the dye and the crystalloidal material being so chosen that particles thereof are liquid under the conditions of coating so as to form droplets having a particle size on the order of one micron within the coating; and washing out the unpolymerized portions of the exposed hydrophilic coating to form a colored photoresist.

14. The process as defined in claim 13 wherein unpolymerized portions are washed out by means of water.

References Cited in the file of this patent

UNITED STATES PATENTS

| | | |
|---|---|---|
| 1,587,274 | Beebe et al. | June 1, 1926 |
| 1,975,959 | Lawson et al. | Oct. 9, 1934 |
| 2,099,297 | Clement | Nov. 16, 1937 |
| 2,377,752 | Britton et al. | June 5, 1945 |
| 2,461,023 | Barnes et al. | Feb. 8, 1949 |
| 2,473,548 | Smith | June 21, 1949 |
| 2,473,549 | Smith | June 21, 1949 |
| 2,480,749 | Marks | Aug. 30, 1949 |
| 2,500,023 | Burk | Mar. 7, 1950 |
| 2,835,582 | Fowler et al. | May 20, 1958 |
| 2,852,386 | Tong | Sept. 16, 1958 |
| 2,875,047 | Oster | Feb. 24, 1959 |
| 3,016,308 | Macaulay | Jan. 9, 1962 |
| 3,038,800 | Luckey et al. | June 12, 1962 |
| 3,050,390 | Levinos et al. | Aug. 21, 1962 |

OTHER REFERENCES

Webster's New International Dictionary, 2nd ed., Unabridged, G. & C. Merriam Co., publishers, Springfield, Mass., 1956, pages 529 and 639.